US012772702B2

(12) United States Patent
Kim et al.

(10) Patent No.: US 12,772,702 B2
(45) Date of Patent: Oct. 20, 2026

(54) DISPLAY DEVICE

(71) Applicant: Samsung Display Co., LTD., Yongin-si (KR)

(72) Inventors: Donghwan Kim, Yongin-si (KR); Jeongweon Seo, Yongin-si (KR); Junghoon Shin, Yongin-si (KR); Junwoo You, Yongin-si (KR); Jaesang Lee, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 372 days.

(21) Appl. No.: 18/537,035

(22) Filed: Dec. 12, 2023

(65) Prior Publication Data

US 2024/0292714 A1 Aug. 29, 2024

(30) Foreign Application Priority Data

Feb. 27, 2023 (KR) ........................ 10-2023-0025936

(51) Int. Cl.
*H10K 59/80* (2023.01)
*H10K 102/00* (2023.01)

(52) U.S. Cl.
CPC ..... *H10K 59/873* (2023.02); *H10K 2102/311* (2023.02)

(58) Field of Classification Search
CPC ........... H10K 59/873; H10K 2102/311; H10K 50/844; H10K 59/87; B32B 7/12; B32B 9/005; B32B 9/007; B32B 15/00; B32B 2037/243; B32B 2255/06; B32B 2255/10; B32B 2255/26; B32B 2457/20
USPC ............................................................ 257/40
See application file for complete search history.

(56) References Cited

U.S. PATENT DOCUMENTS

| | | | | |
|---|---|---|---|---|
| 11,258,044 | B2 | 2/2022 | Kwon et al. | |
| 2016/0306452 | A1* | 10/2016 | Jung | G02F 1/13363 |
| 2018/0013095 | A1* | 1/2018 | Choi | H10K 59/8722 |
| 2021/0118589 | A1* | 4/2021 | Ooishi | G06F 3/0446 |
| 2021/0257582 | A1* | 8/2021 | Kim | G06F 1/1637 |
| 2022/0310971 | A1* | 9/2022 | Lee | H10K 59/87 |

FOREIGN PATENT DOCUMENTS

| | | | |
|---|---|---|---|
| KR | 101585512 | B1 | 1/2016 |
| KR | 101657200 | B1 | 9/2016 |
| KR | 102094917 | B1 | 3/2020 |
| KR | 20210002172 | A | 1/2021 |

* cited by examiner

*Primary Examiner* — Tong-Ho Kim
(74) *Attorney, Agent, or Firm* — CANTOR COLBURN LLP

(57) ABSTRACT

Disclosed is a display device including a display panel, a coating layer disposed beneath the display panel, and a protective layer disposed beneath the coating layer, wherein the coating layer includes a first base layer containing an organic material and having a viscosity equal to or greater than about 1000 cps, and a plurality of first fillers dispersed in the first base layer, wherein the protective layer contains one of a metal, a metal oxide, and a conductive polymer, and a pencil hardness of a bottom surface of the protective layer is equal to or greater than H. Accordingly, a thickness of the display device is reduced and a scratch resistance is improved.

19 Claims, 9 Drawing Sheets

DISPLAY DEVICE

This application claims priority to Korean Patent Application No. 10-2023-0025936, filed on Feb. 27, 2023, and all the benefits accruing therefrom under 35 U.S.C. § 119, the content of which in its entirety is herein incorporated by reference.

BACKGROUND

1. Field

The present disclosure relates to a display device, and more particularly, to a display device including a lower member of a display panel with improved reliability.

2. Description of Related Art

Various display devices used in multimedia devices such as a television, a mobile phone, a tablet computer, a game console, and the like are being developed. The display device may include various functional layers to provide a color image of an excellent quality to a user.

In one example, recently, to implement various types of display devices such as a display device including a curved surface, a rollable display device, a foldable display device, or the like, research on a thin display device is being conducted.

SUMMARY

Embodiments of the invention provide a display device with improved scratch resistance by disposing a coating layer as a display panel lower member.

According to an embodiment, a display device includes a display panel, a coating layer disposed beneath the display panel, and a protective layer disposed beneath the coating layer, the coating layer includes a first base layer containing an organic material and having a viscosity equal to or greater than about 1000 cps, and a plurality of first fillers dispersed in the first base layer, and the protective layer contains one of a metal, a metal oxide, and a conductive polymer, and a pencil hardness of a bottom surface of the protective layer is equal to or greater than H.

In an embodiment, the pencil hardness of the bottom surface of the protective layer may be greater than a pencil hardness of a bottom surface of the coating layer.

In an embodiment, a specific resistance of the protective layer may be equal to or smaller than about $1\times10^{-4}$ Ωcm.

In an embodiment, an average diameter of the plurality of first fillers may be equal to or greater than about 5 μm and equal to or smaller than about 70 μm.

In an embodiment, a thickness of the coating layer may be equal to or greater than about 30 μm and equal to or smaller than about 200 μm, and a thickness of the protective layer may be equal to or greater than about 10 μm and equal to or smaller than about 20 μm.

In one implementation, the coating layer may be directly disposed beneath the display panel, and the protective layer may be disposed directly beneath the coating layer.

In an embodiment, the display device may further include a circuit board electrically connected to the display panel, and the protective layer may be in contact with at least a portion of the circuit board.

In an embodiment, the protective layer may include an adhesive layer disposed beneath the first base layer, and a protective film disposed beneath the adhesive layer, and the protective film contains one of a metal, a metal oxide, and a conductive polymer.

In an embodiment, the protective film may contain one of a titanium oxide, a zinc oxide, a tin oxide, a carbon nanotube, graphene, gold, silver, copper, and aluminum.

In an embodiment, the protective layer may include a second base layer disposed beneath the first base layer, and a plurality of second fillers dispersed in the second base layer, and each of the plurality of second fillers may contain one of a metal, a metal oxide, and a conductive polymer.

In an embodiment, an average diameter of the plurality of second fillers may be smaller than an average diameter of the plurality of first fillers.

In an embodiment, an average diameter of the plurality of second fillers may be equal to or greater than about 0.1 μm and equal to or smaller than about 5 μm.

In an embodiment, the second base layer may be a photocurable resin, and the second base layer may be a silicone-based resin, an acrylic-based resin, or an epoxy-based resin.

In an embodiment, each of the plurality of second fillers may contain silver (Ag) and/or graphene.

In an embodiment, a material contained in the first base layer and a material contained in the second base layer may be different from each other.

In an embodiment, a material contained in each of the plurality of first fillers and a material contained in each of the plurality of second fillers may be different from each other.

In an embodiment, a ratio of a mass of the plurality of first fillers to a mass of the first base layer may be higher than a ratio of a mass of the plurality of second fillers to a mass of the second base layer.

According to another embodiment, a display device includes a display panel, and a lower member disposed beneath the display panel, the lower member includes a coating layer disposed beneath the display panel and including a first base layer and a plurality of first fillers dispersed in the first base layer, and a protective layer disposed beneath the coating layer and including a second base layer and a plurality of second fillers dispersed in the second base layer, and a ratio of a mass of the plurality of second fillers to a total mass of the protective layer is smaller than a ratio of a mass of the plurality of first fillers to a total mass of the coating layer.

In an embodiment, a bottom surface of the lower member may be defined as a bottom surface of the protective layer.

BRIEF DESCRIPTION OF THE FIGURES

The above and other objects and features of the invention will become apparent by describing in detail embodiments thereof with reference to the accompanying drawings.

DETAILED DESCRIPTION

Figure 1:
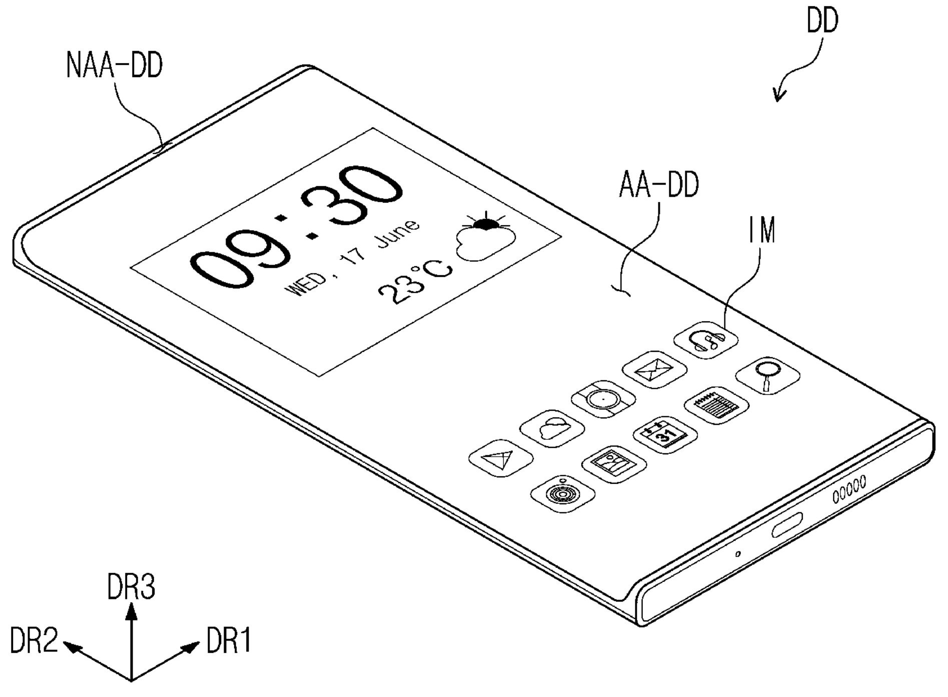
FIG. 1 is a perspective view of a display device, according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

Herein, when a component (or an area, a layer, a portion, and the like) is referred to as being "on", "connected to", or "coupled to" another component, it means that the component may be directly disposed/connected/coupled on another component or a third component may be disposed between the component and another component.

In one example, herein, "directly disposed" may mean that there is no layer, film, area, plate, and the like added between a portion and another portion of a layer, a film, an area, a plate, and the like. For example, "directly disposed" may mean disposing without using an additional member such as an adhesive member or the like between two layers or two members.

Like reference numerals or symbols refer to like components. In addition, in the drawings, thicknesses, ratios, and dimensions of components are exaggerated for effective description of technical content. As used herein, the term "and/or" includes any and all of one or more combinations of the associated components.

Terms such as first, second, and the like may be used to describe various components, but the components should not be limited by the terms. The above terms are used only for the purpose of distinguishing one component from another. For example, without departing from the scope of the invention, a first component may be named as a second component, and similarly, the second component may also be named as the first component. The singular expression includes the plural expression unless the context clearly dictates otherwise.

In addition, terms such as "beneath", "below", "on", "above" are used to describe the relationship of the components shown in the drawings. The above terms are relative concepts, and are described with reference to directions indicated in the drawings.

It should be understood that terms such as "comprise", "include" and/or "have" are intended to specify that a feature, a number, a step, an operation, a component, a part, or a combination thereof described herein is present, and do not preclude a possibility of addition or existence of one or more other features or numbers, steps, operations, components, parts, or combinations thereof.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the invention will be described with reference to the several drawings.

Figure 2:
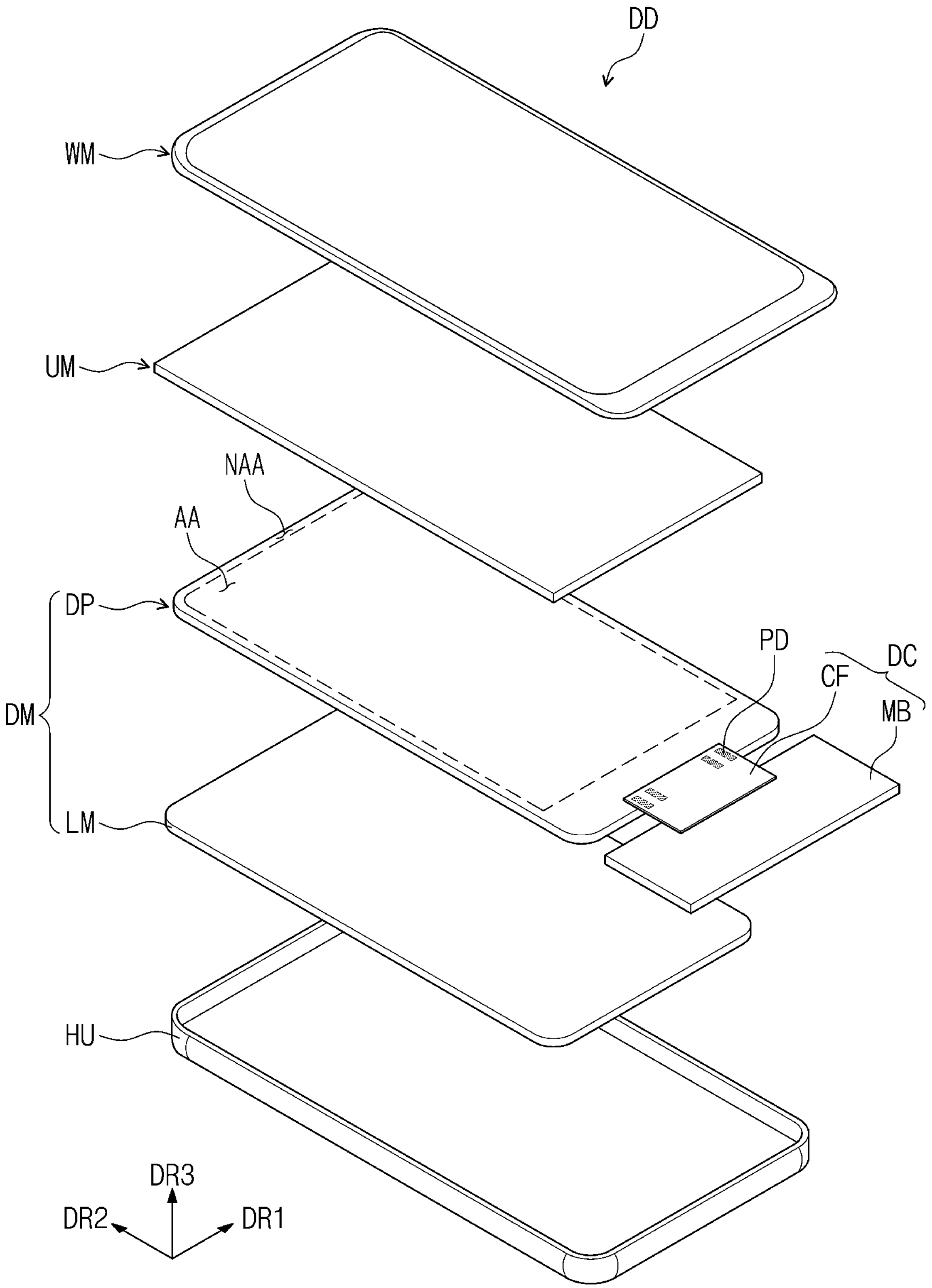
FIG. 2 is an exploded perspective view of a display device, according to an embodiment.

FIG. 1 is a perspective view of a display device DD according to an embodiment. FIG. 2 is an exploded perspective view of the display device DD according to an embodiment.

In an embodiment, it is illustrated in FIG. 1 that the display device DD is a mobile phone. However, the display device DD may not be limited thereto, and may be a small and medium-sized display device such as a tablet PC, a vehicle navigation system, a game console, a wearable device, and/or a camera.

In an embodiment, the display device DD may display an image IM via an active area AA-DD. The active area AA-DD may include a plane defined by a first direction DR1 and a second direction DR2. The active area AA-DD may further include a curved surface bent from at least one side of the plane defined by the first direction DR1 and the second direction DR2. The display device DD of an embodiment shown in FIG. 1 is shown as including two curved surfaces respectively bent from both sides of the plane defined by the first direction DR1 and the second direction DR2. However, a shape of the active area AA-DD is not limited thereto. For example, the active area AA-DD may include only the plane, and the active area AA-DD may include four curved surfaces respectively bent from at least two or, for example, four sides of the plane.

In one example and according to an embodiment, FIG. 1 and the following drawings show first to third directions DR1 to DR3, respectively. Directions indicated by the first to third directions DR1, DR2, and DR3, respectively described herein are relative concepts and are able to be converted into other directions.

Herein, in an embodiment, the first direction DR1 and the second direction DR2 may be orthogonal to each other, and the third direction DR3 may be a normal direction to the plane defined by the first direction DR1 and the second direction DR2. In one example, herein, an expression "on a plane" may indicate when viewed on the plane defined by the first direction DR1 and the second direction DR2, and a thickness direction may mean the third direction DR3 that is in the normal direction to the plane defined by the first direction DR1 and the second direction DR2.

In an embodiment, the display device DD may include the active area AA-DD and a peripheral area NAA-DD disposed adjacent to the active area AA-DD. The active area AA-DD may be a portion corresponding to a display area AA of a display panel DP, which will be described later, and the peripheral area NAA-DD may be a portion corresponding to a non-display area NAA of the display panel DP.

In an embodiment, the peripheral area NAA-DD, as an area blocking an optical signal, may be an area disposed outwardly of the active area AA-DD and surrounding the active area AA-DD. In an embodiment, the peripheral area NAA-DD may be disposed on a side surface of the display device DD instead of a front surface. In another embodiment, the peripheral area NAA-DD may be omitted.

The display device DD of an embodiment may include a window WM, a housing HU, a display module DM, a circuit board DC, and an upper member UM.

The display device DD of an embodiment may include the window WM disposed on the display panel DP. The window WM provides an outer surface of the display device DD. Although not shown, the window WM may include a base substrate, and may further include functional layers such as an anti-reflection layer, an anti-fingerprint layer, and/or an optical layer for controlling a phase.

In the display device DD of an embodiment, the upper member UM may be disposed beneath the window WM and on the display module DM. The upper member UM may include an anti-reflection layer and/or an input sensor. The anti-reflection layer lowers an external light reflectance. The input sensor senses an external input of a user. The upper member UM may further include an adhesive layer for coupling the anti-reflection layer and the input sensor to each other.

In the display device DD of an embodiment, the display module DM may be disposed beneath the upper member UM. The display module DM may include the display panel DP and a lower member LM.

In an embodiment, the display panel DP may include the display area AA where the image IM is displayed and the non-display area NAA adjacent to the display area AA. That is, a front surface of the display panel DP may include the display area AA and the non-display area NAA. The display area AA may be an area activated in response to an electrical signal.

In an embodiment, the non-display area NAA may be disposed adjacent to the display area AA. The non-display area NAA may surround the display area AA. A driving circuit and/or a driving wire for driving the display area AA, various signal lines and/or pads for providing the electrical signal to the display area AA, electronic elements, or the like may be disposed in the non-display area NAA.

In an embodiment, the display panel DP may include a light emitting element layer DP-ED (see FIG. 4) including an organic light emitting element, a quantum dot light emitting element, a micro LED light emitting element, a nano LED light emitting element, or the like. The light emitting element layer DP-ED (see FIG. 4) may be a component that substantially generates the image.

In an embodiment, the display device DD may include the circuit board DC connected to the display panel DP. The circuit board DC may include a flexible substrate CF and a main substrate MB. The flexible substrate CF may include an insulating film and conductive wires mounted on the insulating film. The conductive wires are connected to pads PD to electrically connect the circuit board DC and the display panel DP to each other. In one example, in an embodiment, the flexible substrate CF may be omitted. In this case, the main substrate MB may be directly connected to the display panel DP.

In an embodiment, the main substrate MB may include signal lines and electronic elements not shown. The electronic elements may be electrically connected to the display panel DP by being connected to the signal lines. The electronic elements generate the various electrical signals, for example, a signal for generating the image IM and/or a signal for sensing the external input, and/or process the sensed signal. In one example, the main substrate MB may include a plurality of main substrates respectively corresponding to the electrical signals for the generation and the processing, and may not be limited to any one embodiment.

In an embodiment, the lower member LM may be disposed beneath the display panel DP. The lower member LM may be a member that supports the display panel DP and performs a heat dissipation function of dissipating heat generated from the display panel DP. A detailed description of the lower member LM will be made below after FIG. 5.

The display device DD of an embodiment may include the housing HU disposed beneath the lower member LM. The display panel DP and the like may be accommodated in the housing HU. In the display device DD according to an embodiment, the window WM and the housing HU may be coupled to each other to form an outer appearance of the display device DD.

Figure 3:
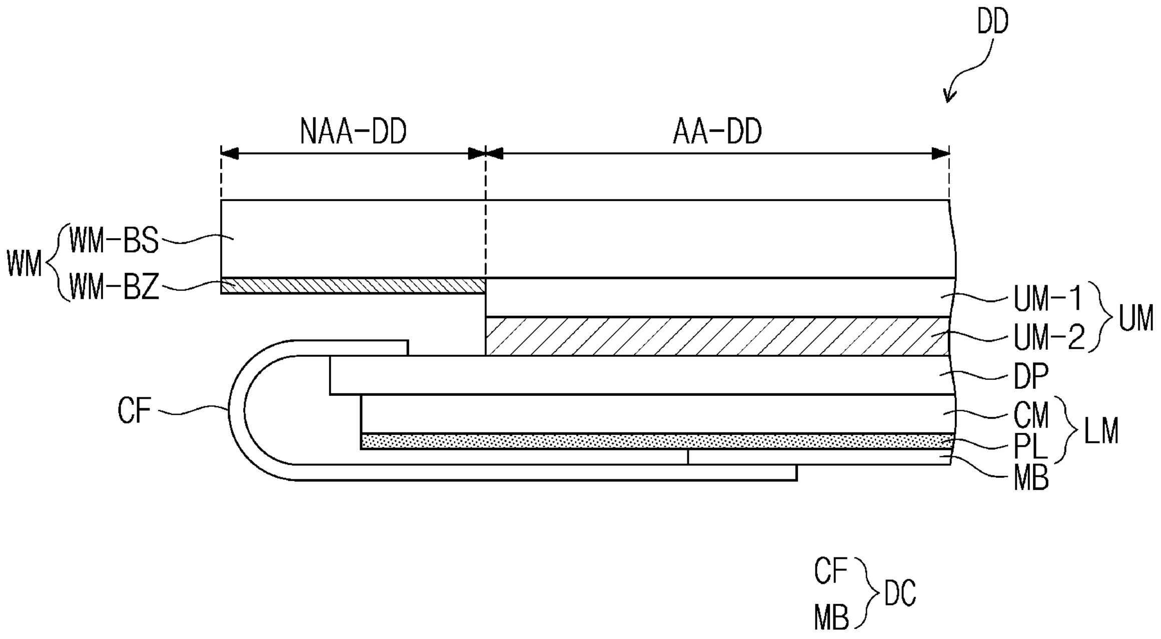
FIG. 3 is a cross-sectional view of a display device, according to an embodiment.

FIG. 3 is a cross-sectional view showing some components of the display device DD according to an embodiment.

Referring to FIG. 3, the display device DD according to an embodiment may include the window WM, the upper member UM, the display panel DP, the circuit board DC, and the lower member LM.

In an embodiment, the window WM may cover the front surface of the display panel DP. The window WM may include a window base substrate WM-BS and a bezel pattern WM-BZ. The window base substrate WM-BS includes a transparent first base layer such as a glass substrate or a transparent film. The bezel pattern WM-BZ may have a multi-layer structure. The multi-layer structure may include a color layer and a black light blocking layer. The color layer and the black light blocking layer may be formed via deposition, printing, and coating processes. The bezel pattern WM-BZ may be omitted from the window WM and may be formed on the upper member UM instead of the window base substrate WM-BS.

In an embodiment, the upper member UM includes an anti-reflection layer UM-1 and an input sensor UM-2.

In an embodiment, the anti-reflection layer UM-1 may lower the external light reflectance. The anti-reflection layer UM-1 may include a phase retarder and/or a polarizer. The anti-reflection layer UM-1 may include a polarizing film and/or color filters. The color filters may have a predetermined arrangement. The arrangement of the color filters may be determined in consideration of colors of emitted light of pixels included in the display panel DP. The anti-reflection layer UM-1 may further include a divided layer adjacent to the color filters.

In an embodiment, the input sensor UM-2 may include a plurality of sensing electrodes (not shown) for sensing the external input, trace lines (not shown) connected to the plurality of sensing electrodes, and an inorganic layer and/or an organic layer for insulating/protecting the plurality of sensing electrodes and/or the trace lines. The input sensor UM-2 may be a capacitive sensor, but may not be particularly limited.

In an embodiment, the input sensor UM-2 may be directly formed on an encapsulation layer ENL in FIG. 4 to be described later via a continuous process when manufacturing the display panel DP. However, the invention may not be limited thereto, and the input sensor UM-2 may be manufactured as a separate panel from the display panel DP and attached to the display panel DP by an adhesive layer.

In an embodiment, unlike that shown in FIG. 3, an adhesive layer may be further disposed between the window WM and the anti-reflection layer UM-1, and an adhesive layer may be further disposed between the anti-reflection layer UM-1 and the input sensor UM-2. The window, the anti-reflection layer UM-1, and the input sensor UM-2 may be coupled to each other via the adhesive layers.

In an embodiment, the circuit board DC may include the flexible substrate CF and the main substrate MB. The flexible substrate CF of one embodiment may be assembled in a bent state. Accordingly, the main substrate MB may be disposed on a rear surface of the display panel DP and may be stably accommodated within a space provided by the housing HU (see FIG. 2). For example, the flexible substrate CF may be bent in a direction of the rear surface of the display panel DP and may be disposed beneath the lower member LM.

In an embodiment, the lower member LM may include a coating layer CM and a protective layer PL. The coating layer CM is disposed beneath the display panel DP, and the protective layer PL is disposed beneath the coating layer CM. The protective layer PL may be in contact with the circuit board DC. In an embodiment, the flexible substrate CF may be assembled in the bent state, and the protective layer PL may be in contact with the main substrate MB. As will be described later, because the protective layer PL has a predetermined conductivity, the circuit board DC and the display panel DP may be electrically connected to each other even when the protective layer PL is disposed between the display panel DP and the circuit board DC. A detailed description of the lower member LM will be made in FIG. 5 and the following drawings.

Figure 4:
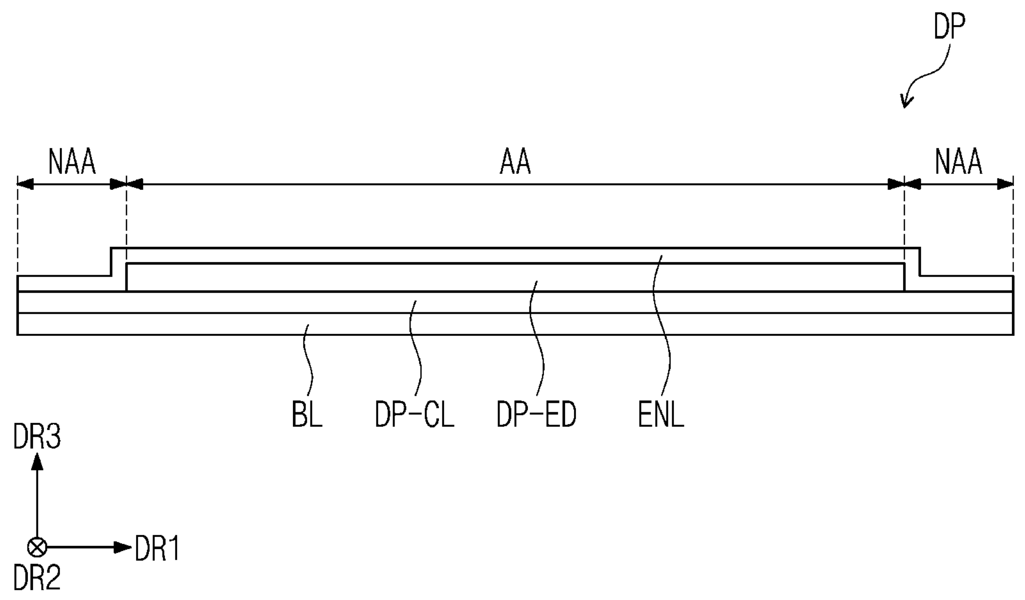
FIG. 4 is a cross-sectional view of a display panel of a display device, according to an embodiment.

FIG. 4 is a cross-sectional view of the display panel DP according to an embodiment.

In an embodiment, the display panel DP includes a base substrate BL, a circuit layer DP-CL disposed on the base substrate BL, the light emitting element layer DP-ED, and the encapsulation layer ENL. The base substrate BL may include a plastic substrate, a glass substrate, a metal substrate, and/or an organic/inorganic composite material substrate. For example, the base substrate BL may include at least one polyimide layer.

In an embodiment, the circuit layer DP-CL includes at least one insulating layer, semiconductor patterns, and conductive patterns. The insulating layer includes at least one inorganic layer and at least one organic layer. The semiconductor patterns and the conductive patterns may constitute signal lines, a pixel driving circuit, and/or a scan driving circuit. In addition, the circuit layer DP-CL may include a rear metal layer.

In an embodiment, the light emitting element layer DP-ED includes a display element, for example, a light emitting element. For example, the light emitting element may be an organic light emitting element, a quantum dot light emitting element, a micro LED light emitting element, or a nano LED light emitting element. The light emitting element layer DP-ED may further include an organic layer such as a pixel defining layer.

In an embodiment, the light emitting element layer DP-ED may be disposed in the display area AA. The non-display area NAA may be disposed outwardly of the display area AA to surround the display area AA, and no light emitting element may be disposed in the non-display area NAA.

In an embodiment, the encapsulation layer ENL may be disposed on the light emitting element layer DP-ED to cover the light emitting element layer DP-ED. The encapsulation layer ENL may be disposed on the circuit layer DP-CL to encapsulate the light emitting element layer DP-ED. The encapsulation layer ENL may be a thin film encapsulation layer including a plurality of organic and inorganic thin films. The encapsulation layer ENL may include a thin film encapsulation layer including a stacked structure of an inorganic layer/an organic layer/an inorganic layer. The stacked structure of the encapsulation layer ENL is not particularly limited.

Figure 5:
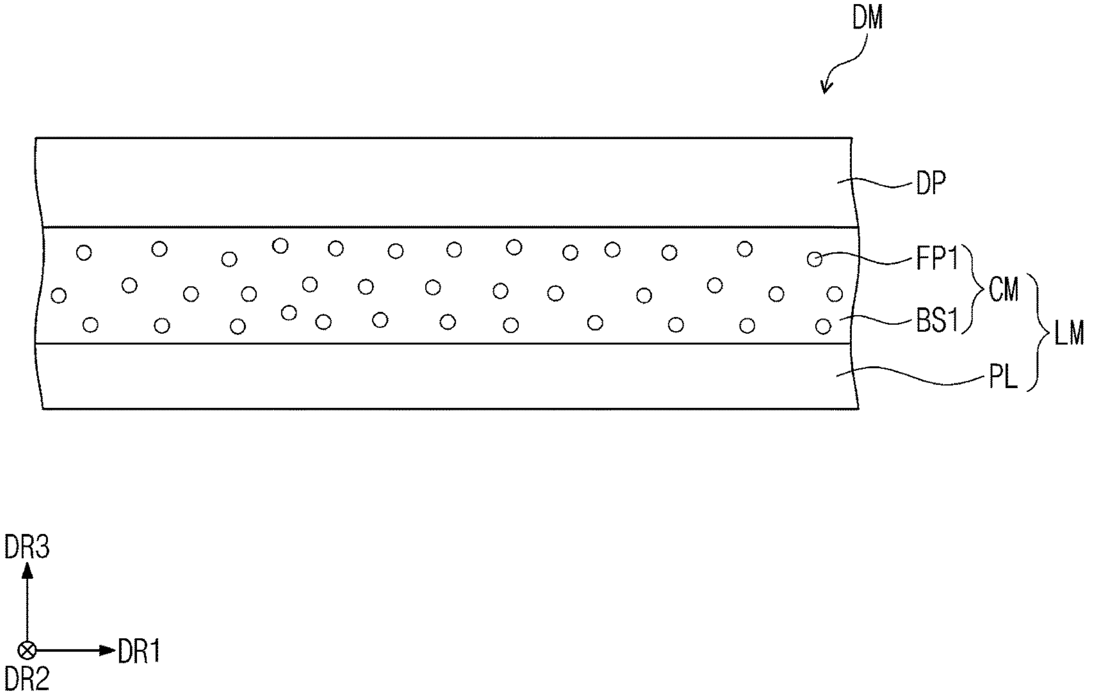
FIG. 5 is a cross-sectional view of a display module, according to an embodiment.

In an embodiment, FIG. 5 is a cross-sectional view showing in detail the display module DM, which is a component of the display device. In an embodiment, FIG. 6 corresponds to a detailed cross-sectional view of the lower member LM included in the display module DM.

Figure 6:
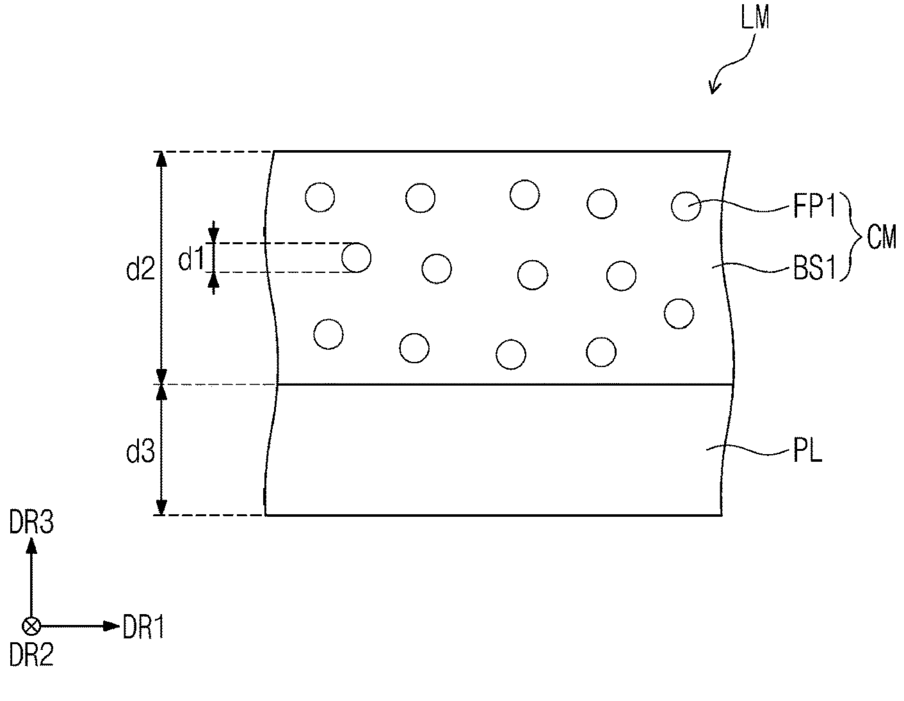
FIG. 6 is a cross-sectional view of a lower member, according to an embodiment.

Referring to FIGS. 5 and 6, the display module DM according to an embodiment may include the display panel DP and the lower member LM disposed beneath the display panel DP. The display module DM may be composed of the display panel DP and the lower member LM. The lower member LM may be disposed directly beneath the display panel DP.

In an embodiment, the lower member LM includes the coating layer CM and the protective layer PL disposed beneath the coating layer CM. The lower member LM may be composed of only the coating layer CM and the protective layer PL disposed beneath the coating layer CM. In the display device according to an embodiment, only the coating layer CM and the protective layer PL may be disposed beneath the display panel DP. A bottom surface of the lower member LM may be defined as a bottom surface of the protective layer PL. That is, the bottommost surface of the display module DM may be defined as the bottommost surface of the protective layer PL. Accordingly, according to an embodiment, a thickness of the display device may be reduced and parts may be simplified, and a process efficiency may be increased during manufacturing of the display device.

In an embodiment, the coating layer CM may be directly disposed beneath the display panel DP. The coating layer CM includes a first base layer BS1 and a plurality of first fillers FP1 dispersed in the first base layer BS1. The coating layer CM may be a single layer composed of the first base layer BS1 and the plurality of first fillers FP1. The plurality of first fillers FP1 may be fillers that are dispersed in the first base layer BS1.

In an embodiment, because the coating layer CM includes the first base layer BS1 and the plurality of first fillers FP1, the coating layer CM may perform multiple functions in an electronic device. For example, the coating layer CM may support the display panel DP. The coating layer CM may protect the display panel DP and the like from a physical impact applied from the outside of the display device DD. The coating layer CM may perform the heat dissipation function that dissipates the heat generated from the display panel DP. The coating layer CM may have a function such as electromagnetic wave shielding. However, the invention may not be limited thereto, and the coating layer CM may additionally perform other functions within the display device DD depending on characteristics such as a thickness, a material, and the like of the coating layer CM.

In an embodiment, a thickness d2 of the coating layer CM may be equal to or greater than about 30 μm and equal to or smaller than about 300 μm. For example, the thickness d2 of the coating layer CM may be equal to or greater than about 30 μm and equal to or smaller than about 100 μm. A viscosity of the coating layer CM may be equal to or greater than about 1000 cps and equal to or smaller than about 100,000 cps. For example, the viscosity of the coating layer CM may be equal to or greater than about 1000 cps and equal to or smaller than about 20,000 cps. Accordingly, the coating layer CM may support the display panel DP or the like within the display device.

In an embodiment, the first base layer BS1 may be a layer providing a base material in which the plurality of first fillers FP1 are dispersed. The first base layer BS1 may contain an organic material. The first base layer BS1 may be formed by containing at least one of an acrylic-based polymer, a urethane-based polymer, a silicone-based polymer, and an imide-based polymer. The first base layer BS1 may contain a material having a predetermined strength.

In an embodiment, each of the plurality of first fillers FP1 may contain an organic material or an inorganic material. For example, each of the plurality of first fillers FP1 may contain graphite and/or metal particles. The plurality of first fillers FP1 may contain the same material or different materials. Accordingly, the coating layer CM may perform the multiple functions such as the heat dissipation and the shielding of the display device.

In an embodiment, an average diameter d1 of the plurality of first fillers FP1 may be equal to or greater than about 1 μm and equal to or smaller than about 70 μm. For example, the average diameter d1 of the plurality of first fillers FP1 may be equal to or greater than about 10 μm and equal to or smaller than about 50 Um. FIG. 6 shows that the first fillers FP1 have the same diameter as an example, but the invention is not limited thereto. The first fillers FP1 may be substantially monodisperse in a size distribution and/or may be polydisperse in the distribution obtained by mixing a plurality of particles that are monodisperse in the distribution with each other.

In an embodiment, the plurality of first fillers FP1 may have a content equal to or greater than about 30 wt % and equal to or smaller than about 80 wt % with respect to total materials contained in the coating layer CM. For example, the plurality of first fillers FP1 may have a content equal to or greater than about 50 wt % and equal to or smaller than about 80 wt % with respect to the total materials contained in the coating layer CM.

In an embodiment, the protective layer PL is disposed beneath the coating layer CM. The protective layer PL may be directly disposed beneath the coating layer CM. The protective layer PL may contain one of a metal, a metal oxide, and a conductive polymer. For example, the protective layer PL may contain one of a titanium oxide, a zinc oxide, a tin oxide, a carbon nanotube, graphene, gold, silver, copper, and/or aluminum. Accordingly, the protective layer PL may have a predetermined conductivity and may perform the functions of the electromagnetic wave shielding and the heat dissipation.

In an embodiment, a thickness d3 of the protective layer PL may be smaller than the thickness d2 of the coating layer CM. The thickness of the protective layer PL may be equal to or greater than about 5 μm and equal to or smaller than about 30 μm. For example, the protective layer PL may have a thickness equal to or greater than about 10 μm and equal to or smaller than about 20 μm.

In an embodiment, a pencil hardness of a bottom surface of the protective layer PL is equal to or greater than H. Herein, the pencil hardness may refer to a pencil hardness measured according to ASTM D3363 with a pencil lead installed on an about 45° slope, a pencil load of about 1000 g, and a pencil moving speed of about 60 mm/min. For example, the pencil hardness of the bottom surface of the protective layer PL may be equal to or greater than H and equal to or smaller than about 9H. As the bottom surface of the protective layer PL according to one embodiment has the pencil hardness equal to or greater than H, a scratch resistance of the coating layer CM disposed on the protective layer PL may be improved. The pencil hardness of the bottom surface of the protective layer PL may be greater than that of a bottom surface of the coating layer CM. As the bottom surface of the protective layer PL has a relatively high hardness compared to the bottom surface of the coating layer CM, the protective layer PL may perform a function of protecting the coating layer CM. The protective layer PL may protect the coating layer CM from an external impact and a scratch that may occur during the manufacture of the display device according to an embodiment.

In an embodiment, a specific resistance of the protective layer PL may be equal to or smaller than about $1\times10^{-4}$ Ω·cm. For example, the specific resistance of the protective layer PL of one embodiment may be equal to or greater than about $1\times10^{-6}$ Ω·cm and equal to or smaller than about $1\times10^{-4}$ Ω·cm. Accordingly, the protective layer PL according to an embodiment has a predetermined conductivity, so that, even when the protective layer PL is disposed between the circuit board DC (see FIG. 3) and the display panel DP (see FIG. 3), the circuit board DC (see FIG. 3) and the display panel DP (see FIG. 3) may be electrically connected to each other.

In an embodiment, the display device according to an embodiment includes the single coating layer for performing the multiple functions beneath the display panel, thereby reducing the thickness of the display device and simplifying the parts. The display panel includes the light emitting element, so that various side effects occur. Conventional display devices include a plurality of members such as a shielding layer, a heat dissipating layer, a cushion layer, a support layer, and the like below the display panel to reduce the side effects. In contrast, the present invention includes the coating layer containing the plurality of first fillers that perform the above functions to perform the functions previously performed by the plurality of layers, and at the same time, to obtain the effects of the thickness reduction, the parts simplification, and the manufacturing process efficiency increase. In addition, in the display device according to an embodiment of the present invention, an impact resistance and a scratch resistance of the coating layer and the display panel may be increased by disposing the protective layer having the high hardness characteristics beneath the coating layer. In addition, as the protective layer has the predetermined conductivity, even when the protective layer is included in the display panel lower member, the electrical connectivity between the display panel and the circuit board may be maintained. Therefore, as the display device according to an embodiment of the present invention includes the coating layer and the protective layer, the impact resistance and the scratch resistance of the display panel or the like are improved, thereby providing a display device with an improved reliability.

Figure 7A:
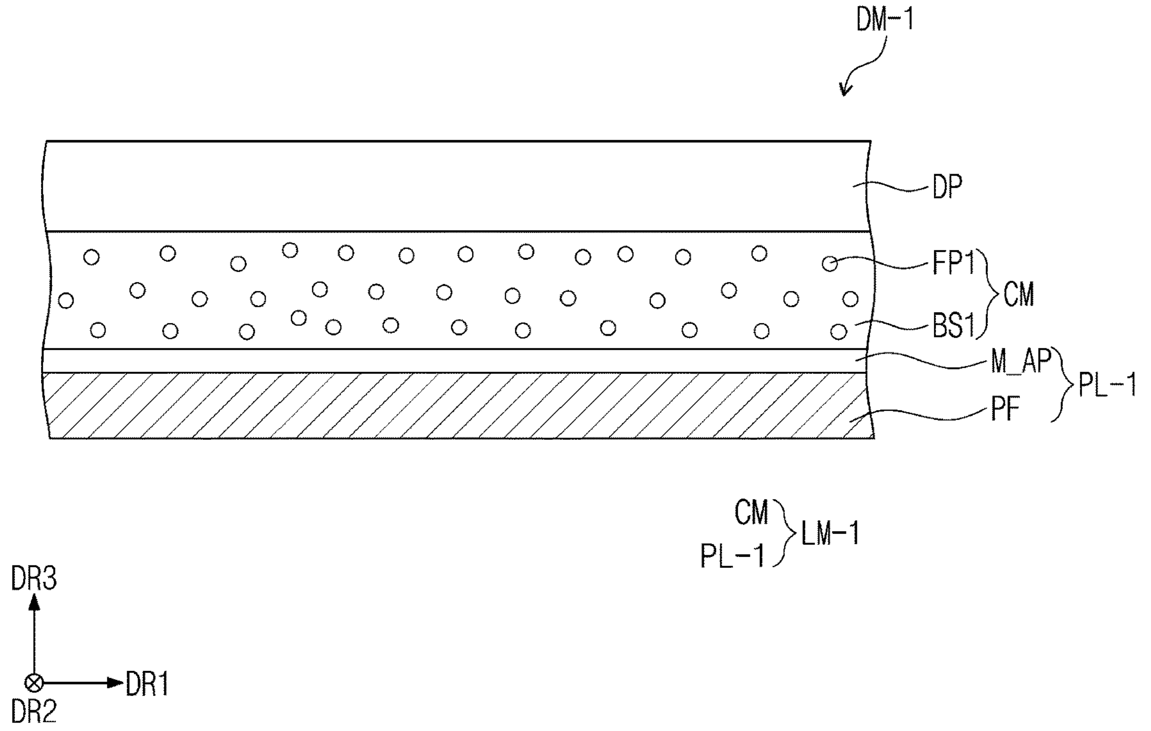
FIG. 7A is a cross-sectional view of display modules, according to an embodiment.
Figure 7B:
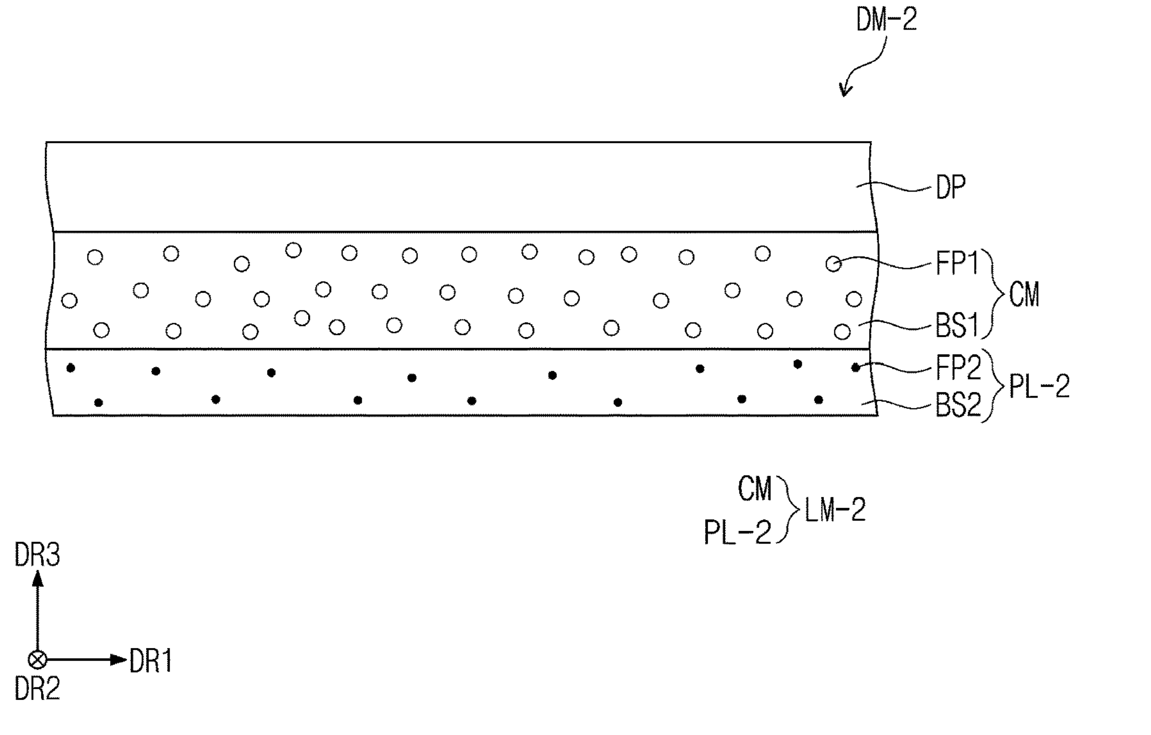
FIG. 7B is a cross-sectional view of display modules, according to an embodiment.
Figure 8:
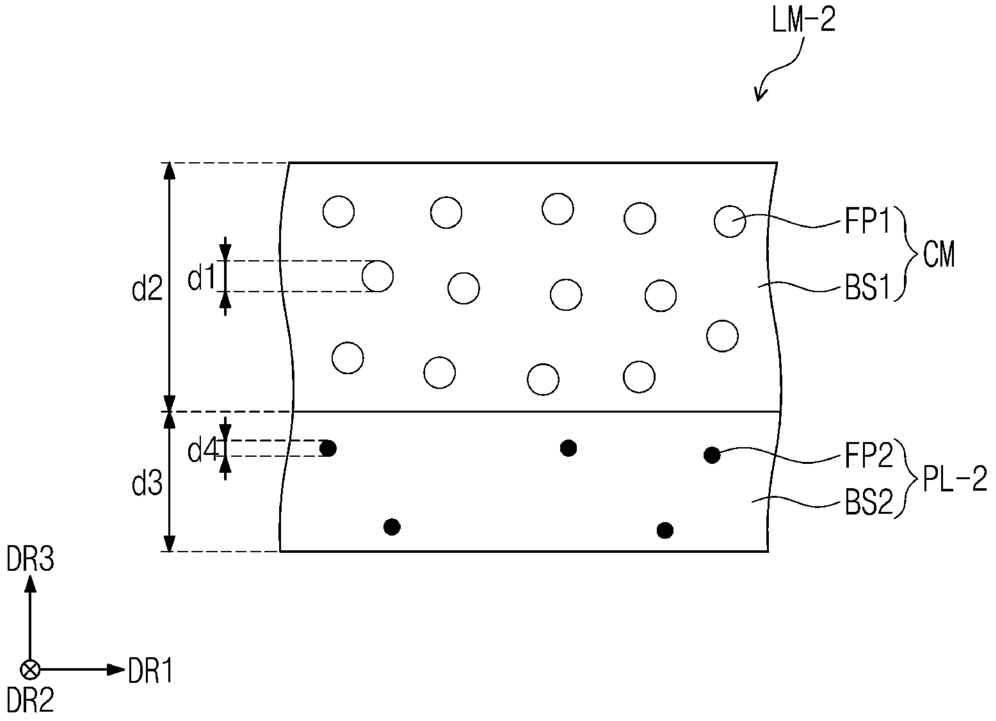
FIG. 8 is a cross-sectional view of a lower member, according to another embodiment.

FIGS. 7A and 7B are cross-sectional views respectively showing display modules DM-1 and DM-2 according to other embodiments in detail. FIG. 8 is a detailed cross-sectional view of a lower member LM-2 according to an embodiment. FIG. 7A shows a case in which a lower member LM-1 of an embodiment includes a protective film PF, and FIG. 7B shows a case in which the lower member LM-2 of an embodiment includes a second base layer BS2 and a plurality of second fillers FP2.

Referring to FIG. 7A, the display module DM-1 according to an embodiment may include the display panel DP and the lower member LM-1 disposed beneath the display panel DP. The lower member LM-1 of an embodiment may include the coating layer CM and a protective layer PL-1, and the protective layer PL-1 may include an adhesive layer M_AP and the protective film PF. The lower member LM-1 of an embodiment may be composed of the coating layer CM, the adhesive layer M_AP, and the protective film PF, so that a bottom surface of the display module DM-1 may be defined as a bottom surface of the protective film PF.

In an embodiment, the adhesive layer M_AP may be disposed beneath the coating layer CM. The adhesive layer M_AP may be directly disposed beneath the coating layer CM. The adhesive layer M_AP may connect the coating layer CM and the protective film PF to each other. The adhesive layer M_AP may include a pressure sensitive adhesive film (PSA) or an adhesive resin layer.

In an embodiment, the protective film PF may be disposed beneath the adhesive layer M_AP. The protective film PF may be directly disposed beneath the adhesive layer M_AP. The protective film PF may contain one of a metal, a metal oxide, and a conductive polymer. The protective film PF may contain one of a titanium oxide, a zinc oxide, a tin oxide, a carbon nanotube, graphene, gold, silver, copper, and aluminum. For example, the protective film PF may include an indium tin oxide (ITO) film.

Referring to FIG. 7B, the display module DM-2 of an embodiment may include the display panel DP and the lower member LM-2 disposed beneath the display panel DP. The lower member LM-2 of an embodiment may include the coating layer CM and a protective layer PL-2, and the protective layer PL-2 may include the second base layer BS2 and the plurality of second fillers FP2.

In an embodiment and referring to FIGS. 7B and 8, the protective layer PL-2 may include the second base layer BS2 disposed beneath the coating layer CM. The second base layer BS2 may be directly disposed beneath the coating layer CM. The second base layer BS2 may be a layer providing a base material in which the plurality of second fillers FP2 are dispersed. The second base layer BS2 may contain an organic material. The second base layer BS2 may contain a curable resin. For example, the second base layer BS2 may be a photocurable resin. The second base layer BS2 may be formed by polymerization and curing by an ultraviolet ray. The second base layer BS2 may be formed by containing at least one of an acrylic-based polymer, a urethane-based polymer, a silicone-based polymer, and an imide-based polymer. For example, the second base layer BS2 may be one of a silicone-based resin, an acrylic-based resin, and an epoxy-based resin.

In an embodiment, the protective layer PL-2 may contain the plurality of second fillers FP2 dispersed in the second base layer BS2. Each of the plurality of second fillers FP2 may contain one of a metal, a metal oxide, and a conductive polymer. For example, each of the plurality of second fillers FP2 may contain silver (Ag) or graphene. The plurality of second fillers FP2 may contain the same material or different materials.

In an embodiment, an average diameter of the plurality of second fillers FP2 may be equal to or greater than about 0.1 μm and equal to or smaller than about 10 μm. For example, the average diameter of the plurality of second fillers FP2 may be equal to or greater than about 1 μm and equal to or smaller than about 5 μm. FIG. 8 shows that the second fillers FP2 have the same diameter as an example, but the invention is not limited thereto. The second fillers FP2 may be substantially monodisperse in a size distribution or may be polydisperse in the distribution obtained by mixing a plurality of particles that are monodisperse in the distribution with each other.

In an embodiment, the plurality of second fillers FP2 may have a content equal to or greater than about 10 wt % and equal to or smaller than about 50 wt % with respect to total materials contained in the protective layer PL-2. For example, the plurality of second fillers FP2 may have a content equal to or greater than about 20 wt % and equal to or smaller than about 40 wt % with respect to the total materials contained in the protective layer PL-2.

In an embodiment, a ratio of the content of the plurality of first fillers FP1 to the total materials contained in the coating layer CM is higher than a ratio of the content of the plurality of second fillers FP2 to the total materials contained in the protective layer PL-2. An average diameter d4 of the plurality of second fillers FP2 in the protective layer PL-2 may be smaller than the average diameter d1 of the plurality of first fillers FP1 in the coating layer CM. Accordingly, even when a predetermined amount of friction occurs on a bottom surface of the protective layer PL-2 during the manufacture of the display device according to an embodiment, a degree to which the second fillers FP2 are pushed by the friction may be reduced.

When manufacturing the display device including the lower member, at least some of the plurality of first fillers may be pushed or smudged to another member by a predetermined pressure or friction on the bottom surface of the coating layer. However, in the display device according to an embodiment, the protective layer is disposed beneath the coating layer, and the ratio of the content of the plurality of second fillers to the total materials contained in the protective layer is lower than the ratio of the content of the plurality of first fillers to the total materials contained in the coating layer, so that a pushing phenomenon of the bottom surface resulted from the friction may be prevented and the scratch resistance may be improved. Accordingly, an embodiment may provide the display device with the improved reliability.

In an embodiment, the material contained in the protective layer PL-2 may be different from the material contained in the coating layer CM. The material contained in the second base layer BS2 of the protective layer PL-2 may be different from the material contained in the first base layer BS1 of the coating layer CM. The material contained in the second fillers FP2 of the protective layer PL-2 may be different from the material contained in the first fillers FP1 of the coating layer CM. However, in another embodiment, the material contained in the protective layer PL-2 may be the same as the material contained in the coating layer CM, when necessary. The material contained in the second base layer BS2 of the protective layer PL-2 may be the same as the material contained in the first base layer BS1 of the coating layer CM, and the material contained in the second fillers FP2 of the protective layer PL-2 may be the same as the material contained in the first fillers FP1 of the coating layer CM. That is, a content ratio of the second fillers FP2 to the plurality of protective layers PL and a content ratio of the first fillers FP1 to the coating layer CM may be different from each other, but the material contained in the protective layer PL-2 and the material contained in the coating layer CM may be the same as each other.

Hereinafter, a method for manufacturing a display device according to an embodiment will be described with reference to the drawings. The characteristics of the display device described in FIGS. 1 to 8 will not be described again, and characteristics of the method for manufacturing the display device will be mainly described.

FIGS. 9A to 9D are cross-sectional views of some steps of a method for manufacturing a display device according to an embodiment. FIGS. 10A and 10B are cross-sectional views of some steps of a method for manufacturing a display device according to another embodiment of the present disclosure.

Figure 9A:
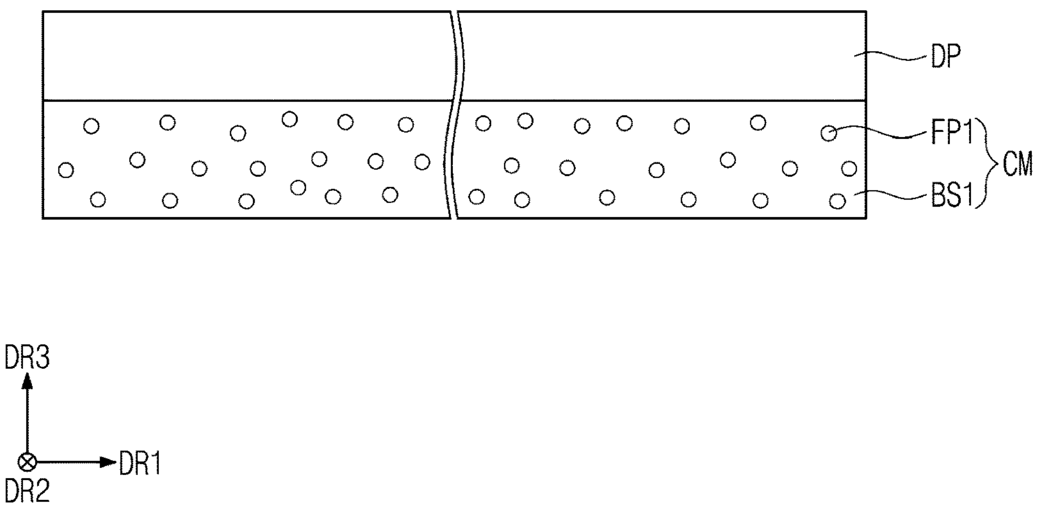
FIG. 9A is a cross-sectional view of some steps of a method for manufacturing a display device, according to an embodiment.
Figure 10A:
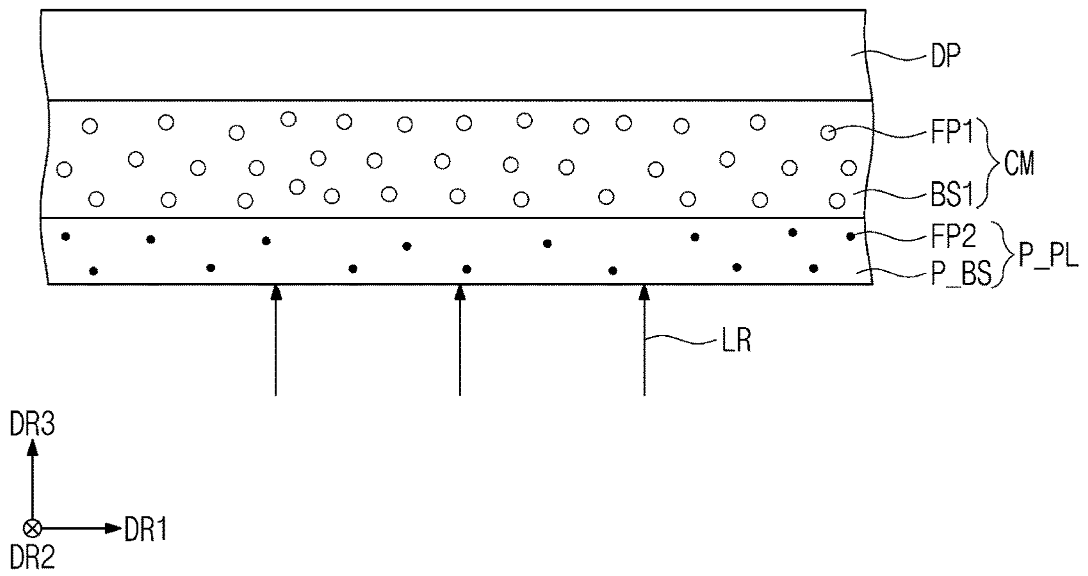
FIG. 10A is a cross-sectional view of some steps of a method for manufacturing a display device, according to an embodiment.
Figure 10B:
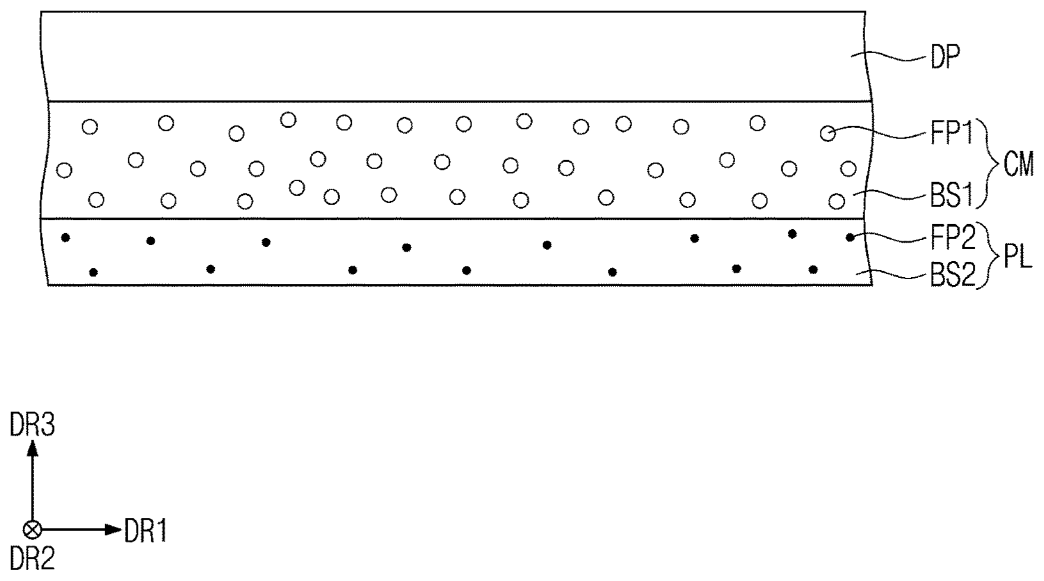
FIG. 10B is a cross-sectional view of some steps of a method for manufacturing a display device, according to an embodiment.

Referring to FIG. 9A, the method for manufacturing the display device according to an embodiment may include providing the display panel DP and the coating layer CM disposed beneath the display panel DP. The coating layer CM may be provided in the form including the first base layer BS1 and the plurality of first fillers FP1 dispersed in the first base layer BS1.

Figure 9B:
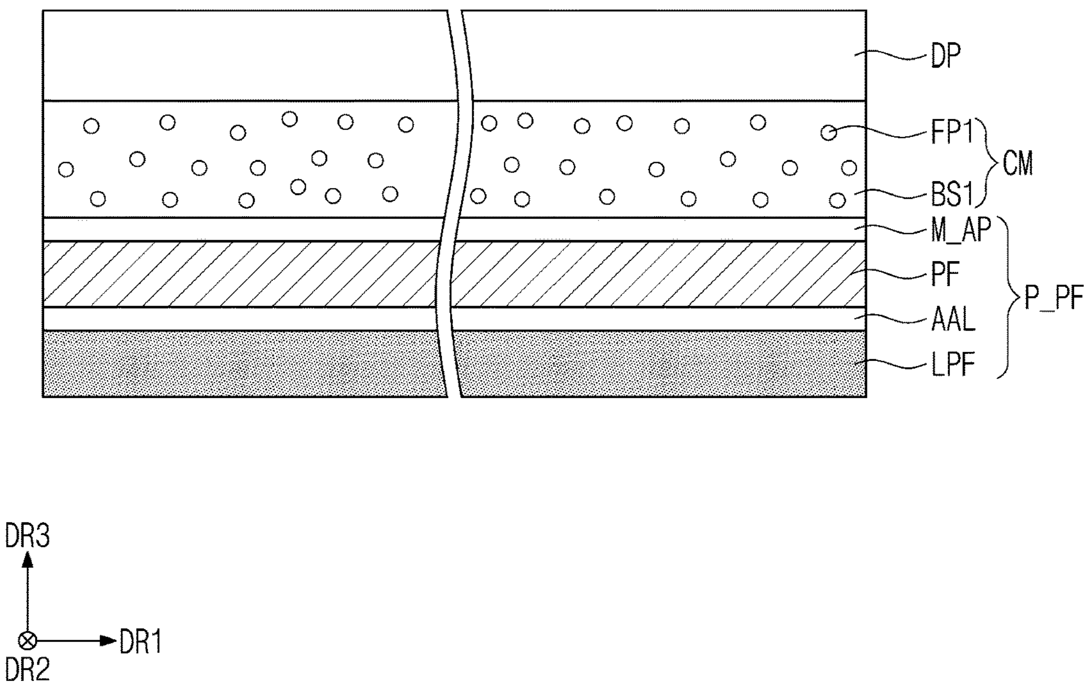
FIG. 9B is a cross-sectional view of some steps of a method for manufacturing a display device, according to an embodiment.
Figure 9C:
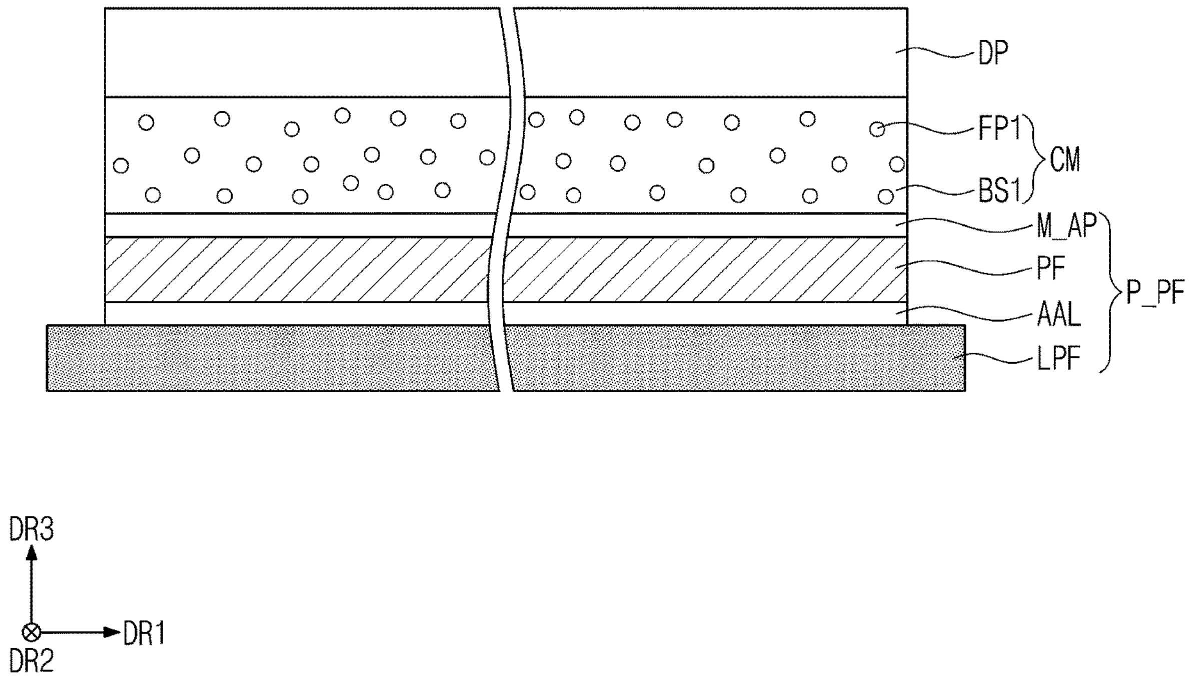
FIG. 9C is a cross-sectional view of some steps of a method for manufacturing a display device, according to an embodiment.

Referring to FIGS. 9B and 9C, the method for manufacturing the display device according to an embodiment may include forming a preliminary protective film P_PF beneath the coating layer CM. The preliminary protective film P_PF of an embodiment may include the adhesive layer M_AP, the protective film PF, a lower adhesive layer AAL, and a lower protective film LPF. The lower protective film LPF may be formed below the protective film PF by the lower adhesive layer AAL. The lower protective film LPF may contain a non-conductive material. For example, the lower protective film LPF may contain polyethylene terephthalate (PET). When manufacturing the display device according to an embodiment, as the lower protective film LPF is further included at the bottommost portion of the coating layer CM, the scratch resistance of the bottom surface of the coating layer CM may be further improved.

In an embodiment and referring to FIG. 9B, a length of the lower protective film LPF in the first direction DR1 may be the same as a length of the protective film PF in the first direction DR1. Referring to FIG. 9C, the length of the lower protective film LPF in the first direction DR1 may be greater than the length of the protective film PF in the first direction DR1. As shown in FIG. 9C, when the length of the lower protective film LPF in the first direction DR1 is relatively greater than that of the protective film PF, the scratch resistance of the protective film PF and the coating layer CM may be improved.

Figure 9D:
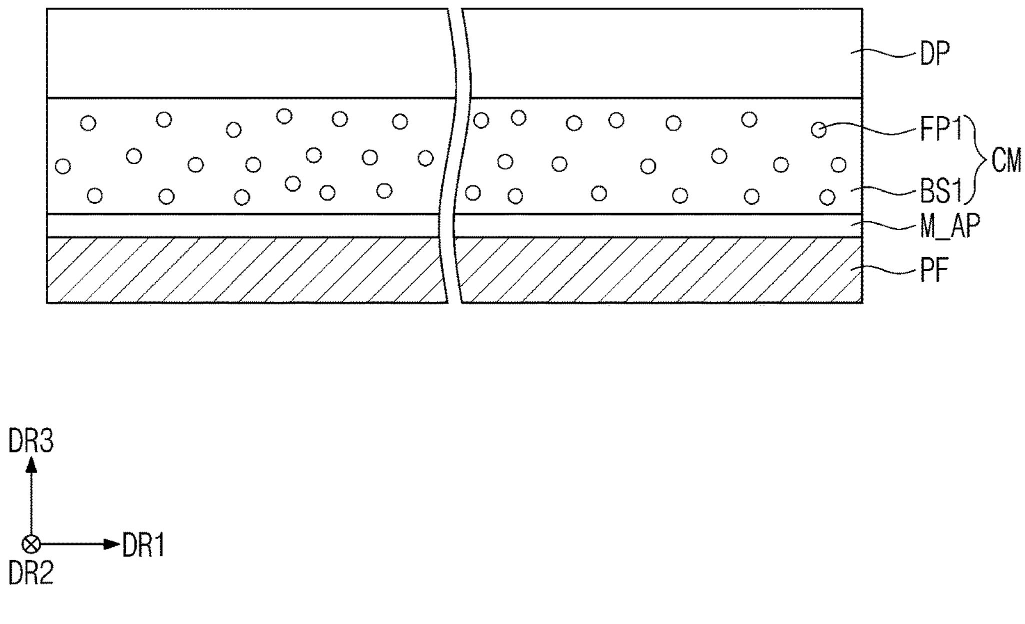
FIG. 9D is a cross-sectional view of some steps of a method for manufacturing a display device, according to an embodiment.

Referring to FIGS. 9B to 9D, the method for manufacturing the display device according to an embodiment may include removing the lower protective film LPF from the bottom surface of the protective film PF. Accordingly, the bottom surface of the protective film PF may define a bottom surface of the display module DM (see FIG. 5). To remove the lower protective film LPF from the bottom surface of the protective film PF, the lower adhesive layer AAL may have a low adhesive strength. The lower adhesive layer AAL for connecting the lower protective film LPF and the protective film PF to each other may have a relatively low adhesive strength compared to the adhesive layer M_AP for connecting the protective film PF and the coating layer CM to each other. When manufacturing the display device according to an embodiment, the removal of the lower protective film LPF may be facilitated as the lower adhesive layer AAL is provided.

Referring to FIG. 10A, the method for manufacturing the display device according to another embodiment may include forming a preliminary protective layer P_PL beneath the coating layer CM. The preliminary protective layer P_PL may include a preliminary base layer P_BS and the plurality of second fillers FP2.

In an embodiment, the forming of the preliminary protective layer P_PL may be performed by a coating process. The forming of the preliminary protective layer P_PL may be performed by at least one of a spin coating method, a slit coating method, a jet printing method, a metal mask printing method, and a screen printing method. For example, the forming of the preliminary protective layer P_PL may be performed by the metal mask printing method or the screen printing method. Accordingly, even when the preliminary protective layer P_PL has physical properties such as thickness and viscosity within the aforementioned numerical ranges, the preliminary protective layer P_PL may be attached to the bottom surface of the coating layer CM.

In an embodiment and referring to FIGS. 10A and 10B, after the forming of the preliminary protective layer P_PL, forming the protective layer PL may be included. The forming of the protective layer PL may include photocuring or thermally curing the preliminary protective layer P_PL. The preliminary protective layer P_PL may contain a curable resin. The preliminary base layer P_BS may be composed of the curable resin. The forming of the protective layer PL may include photocuring the preliminary protective layer P_PL by irradiating light LR to a bottom surface of the preliminary protective layer P_PL. The protective layer PL may be formed as the preliminary protective layer P_PL is cured by the light LR. In an embodiment, the light LR may refer to the ultraviolet ray.

Hereinabove, the description has been achieved with reference to embodiments of the invention, but those skilled in the art or those having ordinary knowledge in the technical field will understand that the invention may be variously modified and changed within the scope without departing from the spirit and technical region of the invention described in the claims to be described later. Accordingly, the technical scope of the invention should not be limited to the content described in the detailed description of the specification.

The display device according to the invention may include the coating layer beneath the display panel, thereby reducing the thickness of the display device via the simplification of the plurality of functional members. An embodiment may provide the display device with the improved reliability as the scratch resistance of the bottom surface of the display device is improved by including the protective layer beneath the coating layer.

Although the present disclosure has been described with reference to embodiments of the invention, it will be understood that the invention should not be limited to these embodiments but various changes and modifications can be made by those skilled in the art without departing from the spirit and scope of the present disclosure. Accordingly, the technical scope of the invention is not intended to be limited to the contents set forth in the detailed description of the specification, but is intended to be defined by the appended claims. Moreover, the embodiments or parts of the embodiments may be combined in whole or in part without departing from the scope of the invention.

What is claimed is:

1. A display device comprising:

a display panel;

a coating layer disposed beneath the display panel; and a protective layer disposed beneath the coating layer, wherein the coating layer includes a first base layer containing an organic material and having a viscosity equal to or greater than about 1000 cps, and a plurality of first fillers dispersed within the first base layer, wherein the protective layer contains one of a metal, a metal oxide, and a conductive polymer, and includes a bottom surface of the protective layer having a pencil hardness equal to or greater than H, wherein the coating layer is disposed on a side of the display panel opposite to a light-emitting direction of the display panel.

2. The display device of claim 1, wherein the pencil hardness is greater than a pencil hardness of a bottom surface of the coating layer.

3. The display device of claim 1, wherein a specific resistance of the protective layer is equal to or smaller than about $1\times10^{-4}$ Ωcm.

4. The display device of claim 1, wherein an average diameter range of the plurality of first fillers is between equal to or greater than about 5 μm and equal to or smaller than about 70 μm.

5. The display device of claim 1, wherein a thickness range of the coating layer is between equal to or greater than about 30 μm and equal to or smaller than about 200 μm, wherein a thickness range of the protective layer is between equal to or greater than about 10 μm and equal to or smaller than about 20 μm.

6. The display device of claim 1, further comprising:

a circuit board electrically connected to the display panel, wherein the protective layer is in contact with at least a portion of the circuit board.

7. The display device of claim 1, wherein the protective layer includes:

an adhesive layer disposed beneath the first base layer; and a protective film disposed beneath the adhesive layer, wherein the protective film contains at least one of a metal, a metal oxide, and a conductive polymer.

8. The display device of claim 7, wherein the protective film contains at least one of a titanium oxide, a zinc oxide, a tin oxide, a carbon nanotube, graphene, gold, silver, copper, and aluminum.

9. The display device of claim 1, wherein the protective layer includes:

a second base layer disposed beneath the first base layer; and a plurality of second fillers dispersed in the second base layer, wherein each of the plurality of second fillers contains at least one of a metal, a metal oxide, and a conductive polymer.

10. The display device of claim 9, wherein a ratio of a mass of the plurality of second fillers to a total mass of the second base layer is lower than a ratio of a mass of the plurality of first fillers to a total mass of the first base layer.

11. The display device of claim 9, wherein an average diameter of the plurality of second fillers is smaller than an average diameter of the plurality of first fillers.

12. The display device of claim 9, wherein an average diameter range of the plurality of second fillers is between equal to or greater than about 0.1 μm and equal to or smaller than about 5 μm.

13. The display device of claim 9, wherein the second base layer is a photocurable resin.

14. The display device of claim 9, wherein the second base layer is a silicone-based resin, an acrylic-based resin, or an epoxy-based resin.

15. The display device of claim 9, wherein each of the plurality of second fillers contains silver (Ag) or graphene.

16. The display device of claim 9, wherein a material contained in the first base layer and a material contained in the second base layer are different from each other.

17. The display device of claim 9, wherein a material contained in each of the plurality of first fillers and a material contained in each of the plurality of second fillers are different from each other.

18. A display device comprising:

a display panel; and a lower member disposed beneath the display panel, wherein the lower member includes:

a coating layer disposed beneath the display panel and including a first base layer and a plurality of first fillers dispersed in the first base layer; and a protective layer disposed beneath the coating layer and including a second base layer and a plurality of second fillers dispersed in the second base layer, wherein a ratio of a mass of the plurality of second fillers to a total mass of the protective layer is smaller than a ratio of a mass of the plurality of first fillers to a total mass of the coating layer, wherein the lower member is disposed on a side of the display panel opposite to a light-emitting direction of the display panel.

19. The display device of claim 18, wherein a bottom surface of the lower member is defined as a bottom surface of the protective layer.

* * * * *